United States Patent
Yu et al.

(10) Patent No.: US 7,292,442 B2
(45) Date of Patent: Nov. 6, 2007

(54) HEAT SINK CLIP AND ASSEMBLY

(75) Inventors: Fang-Xiang Yu, Shenzhen (CN);
Yeu-Lih Lin, Tu Cheng (TW); Ming Yang, Shenzhen (CN)

(73) Assignees: Fu Zhun Precision Industry (Shen Zhen) Co., Ltd., Shenzhen City, Guangdong Province (CN); Foxconn Technology Co., Ltd., Tu-Cheng City, Taipei Hsien (TW)

( * ) Notice: Subject to any disclaimer, the term of this patent is extended or adjusted under 35 U.S.C. 154(b) by 0 days.

(21) Appl. No.: 11/308,705

(22) Filed: Apr. 24, 2006

(65) Prior Publication Data

US 2007/0115638 A1    May 24, 2007

(30) Foreign Application Priority Data

Nov. 18, 2005  (TW) .................... 94140618

(51) Int. Cl.
*H05K 7/20* (2006.01)
(52) U.S. Cl. .............. 361/704; 361/697; 361/703; 361/801; 257/E23.086; 165/80.3; 165/121; 165/185; 174/16.3; 248/510
(58) Field of Classification Search .......... 361/703, 361/704, 707, 709, 710; 257/719, 727; 174/16.3; 165/80.2, 80.3; 24/457
See application file for complete search history.

(56) References Cited

U.S. PATENT DOCUMENTS

| 5,671,118 | A | 9/1997 | Blomquist |
| 6,507,491 | B1 * | 1/2003 | Chen .................... 361/697 |
| 6,731,504 | B1 * | 5/2004 | Liu ..................... 361/704 |
| 7,061,764 | B2 * | 6/2006 | Lai et al. ............... 361/704 |
| 7,079,401 | B2 * | 7/2006 | Lee et al. .............. 361/801 |
| 7,190,584 | B2 * | 3/2007 | Lee et al. .............. 361/703 |
| 7,218,520 | B2 * | 5/2007 | Li et al. ................ 361/704 |
| 2004/0047131 | A1 * | 3/2004 | Lai et al. ............... 361/704 |
| 2006/0034057 | A1 * | 2/2006 | Yang .................... 361/704 |
| 2006/0171125 | A1 * | 8/2006 | Yu et al. ................ 361/710 |

* cited by examiner

*Primary Examiner*—Boris Chervinsky
*Assistant Examiner*—Courtney Smith
(74) *Attorney, Agent, or Firm*—Jeffrey T. Knapp

(57) ABSTRACT

A heat sink clip and an assembly incorporating such clip are provide. The heat sink clip comprises: a body, an actuating member and a movable fastener. The body has a securing portion formed at one end thereof. The actuating member has a hinge portion thereof. The movable fastener is secured to the hinge portion of the actuating member. The actuating member is pivotably mounted to the securing portion of the body in a direction substantially perpendicular to the body, and the actuating member is turnable relative to the body between a locked position and an unlocked position.

16 Claims, 7 Drawing Sheets

HEAT SINK CLIP AND ASSEMBLY

FIELD OF THE INVENTION

The present invention relates to a heat sink assembly, and particularly to a heat sink assembly incorporating a clip which can conveniently mount the heat sink assembly to a heat generating unit.

DESCRIPTION OF RELATED ART

As computer technology continues to advance, electronic components such as computer central processing units (CPUs) are being made to provide faster operational speeds and greater functional capabilities. When a CPU operates at a high speed in a computer enclosure, its temperature can increase greatly. It is desirable to dissipate the generated heat of the CPU quickly, for example, by using a heat sink attached to the surface of the CPU in the enclosure. This allows the CPU and other high-performance electronic components in the enclosure to function within their normal operating temperature ranges, thereby assuring the quality of CPU data management, storage and transfer. Usually, a clip is required for mounting the heat sink to the CPU.

One conventional heat sink clip is shown in US. Pat. No. 5,671,118. The heat sink clip comprises a body and a movable fastener. The body has a locking arm at one end thereof, and has a securing portion at the other end thereof. The movable fastener has an operation handle at an upper portion thereof, and a locking foot at a lower portion thereof. The movable fastener has a punch hole between the operation handle and the locking foot for receiving the securing portion of the body therein.

However, it is difficult to operate the heat sink clip. To generate a downward pressing force against the heat sink via the heat sink clip, it is necessary to press the operation handle downwardly to thereby secure the locking foot of the movable fastener to a retention module. Pressing the operation handle into position requires a lot of force, and it is not easy for the operator to mount the locking foot onto the retention module.

Therefore, an improved heat sink clip for a heat generating unit which can overcome the above problems is desired.

SUMMARY OF INVENTION

A heat sink clip comprises: a body, an actuating member and a movable fastener. The body has a securing portion formed at one end thereof. The actuating member has a hinge portion. The movable fastener is secured to the hinge portion of the actuating member. The actuating member is pivotably mounted to the securing portion of the body in a direction substantially perpendicular to the body, and the actuating member is turnable relative to the body between a locked position and an unlocked position.

Other advantages and novel features of the present invention will be drawn from the following detailed description of a preferred embodiment of the present invention together with the attached drawings, in which:

DETAILED DESCRIPTION

Figure 1:
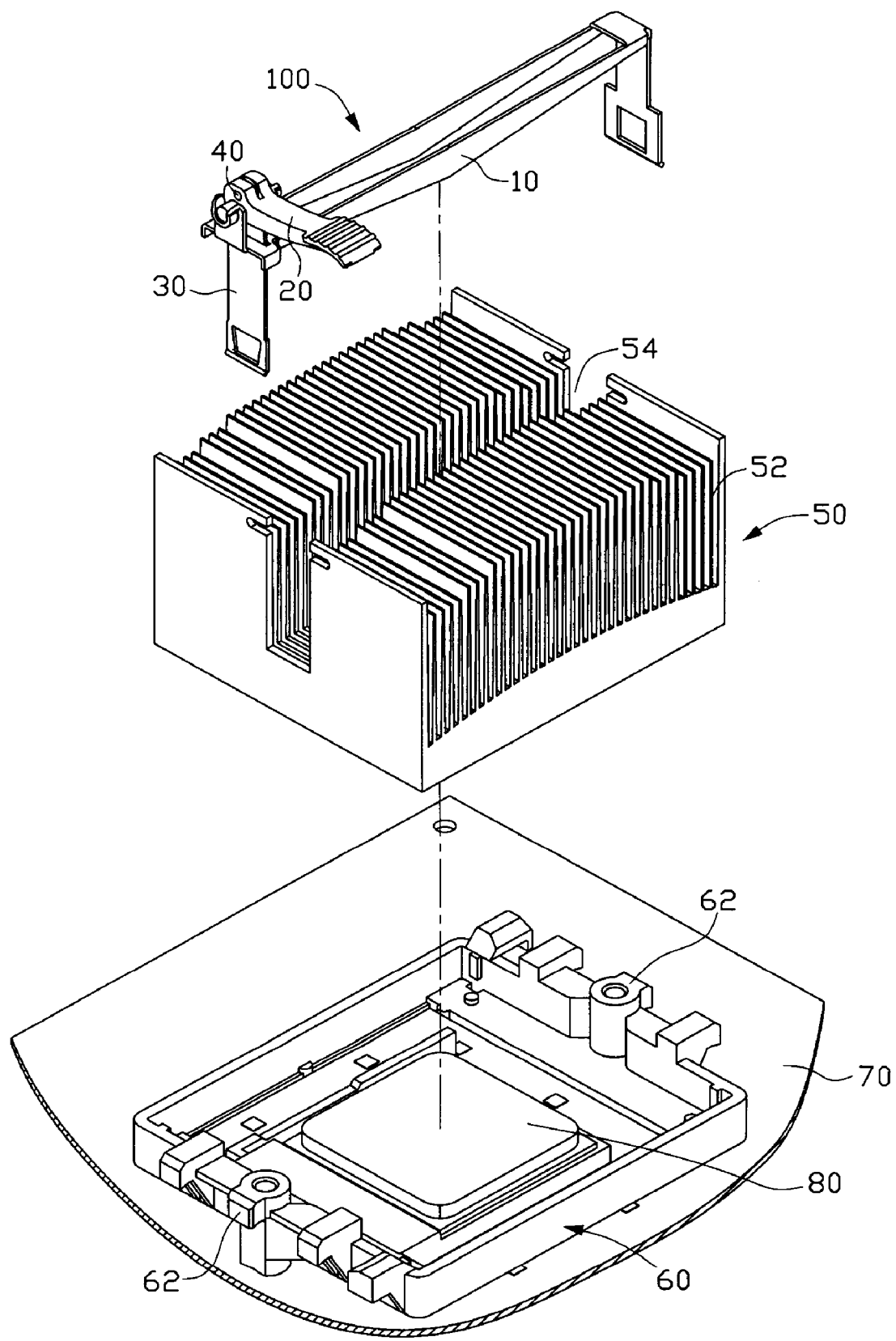
FIG. 1 is an exploded view of a heat sink assembly in accordance with a first preferred embodiment of the present invention.

Referring to FIG. 1, a heat sink assembly in accordance with a first preferred embodiment of the present invention comprises a heat sink clip 100, a heat sink 50, a retention module 60, a printed circuit board 70 and a heat generating unit 80 such as a CPU. The retention module 60 surrounds the heat generating unit 80 mounted on the printed circuit board 70, and the heat sink clip 100 cooperates with the retention module 60 to secure the heat sink 50 onto the heat generating unit 80. Each of two opposite sides of the retention module 60 forms a locking block 62 extending outwardly therefrom. The heat sink 50 has a plurality of upright radiation fins 52 for dissipation of heat, and a locating groove 54 in a middle of the heat sink 50.

Figure 2:
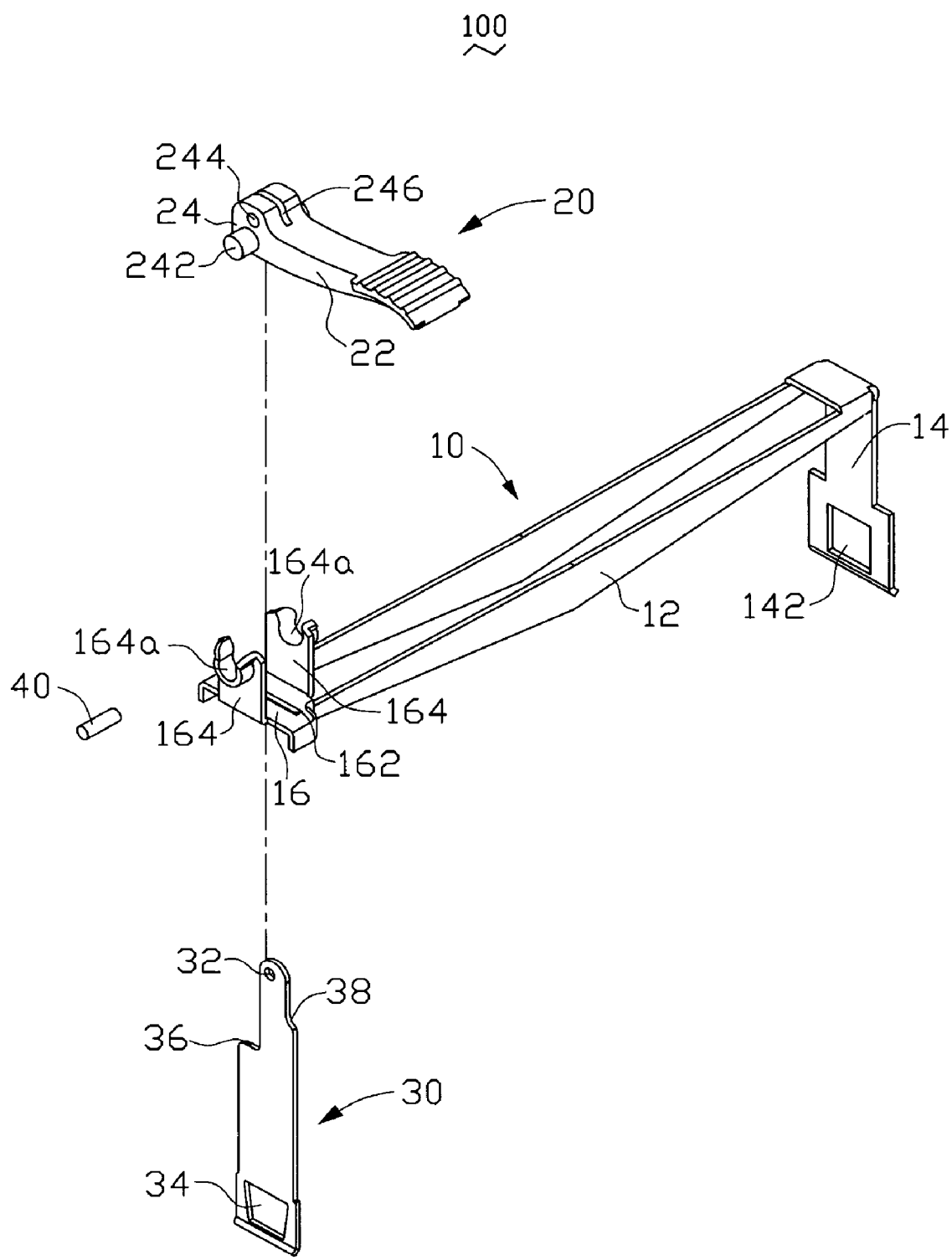
FIG. 2 is an exploded view of a heat sink clip of the heat sink assembly of FIG. 1.

Referring to FIG. 2, the heat sink clip 100 comprises a body 10, an actuating member 20, a movable fastener 30 and a pivot 40.

The body 10 comprises a spring plate 12. The spring plate 12 is a substantially V-shaped resilient metal plate. The spring plate 12 has a locking arm 14 integrally formed at one end thereof, the locking arm 14 is disposed perpendicular to the spring plate 12, and the locking arm 14 defines a mounting hole 142 therein for fastening to the locking block 62 at one side of the retention module 60. The spring plate 12 has a securing portion 16 at the other end thereof. The securing portion 16 defines a slot 162 through top and bottom sides thereof. The securing portion 16 has a pair of bearing plates 164 extending upwardly therefrom. Each of the bearing plates 164 defines a groove 164a at an upper portion thereof.

The actuating member 20 comprises a main body 22. The main body 22 has a hinge portion 24 at one end thereof. Each of two opposite sides of the hinge portion 24 forms a revolving shaft 242 extending outwardly therefrom. The revolving shafts 242 are pivotably mounted in the grooves 164a of the body 10 in such a direction that the actuating member 20 is substantially perpendicular to a main axis of the body 10. A pivot hole 244 is axially defined through the hinge portion 24, and the pivot hole 244 is closer to the other end of main body 22 than the revolving shaft 242. A groove 246 is radially defined through the hinge portion 24 across the pivot hole 244. A plurality of teeth (not labeled) is formed on a top face of the other end of the main body 22 for facilitating manipulation of the actuating member 20.

The movable fastener 30 is an elongated metal plate member corresponding to the locking block 62. A pivot hole 32 is formed in an upper portion of the movable fastener 30. A mounting hole 34 is defined in a lower portion of the movable fastener 30. One side of the movable fastener 30 forms a step 36, and the other side of the movable fastener 30 forms a step 38. The step 36 and step 38 are located between the pivot hole 32 and the mounting hole 34. The step 38 is above the step 36.

Figure 3A:
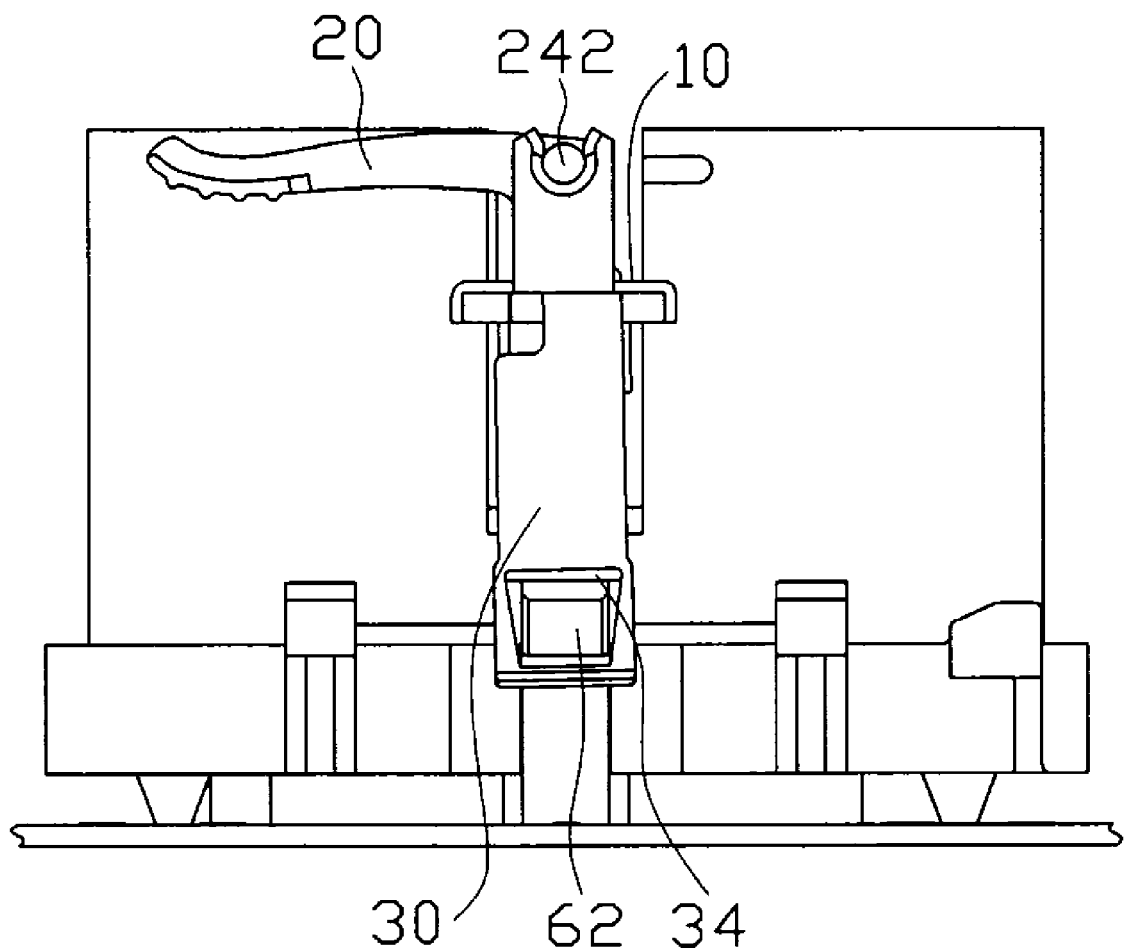
FIG. 3A is a side elevation view of FIG. 1 partially assembled.
Figure 3B:
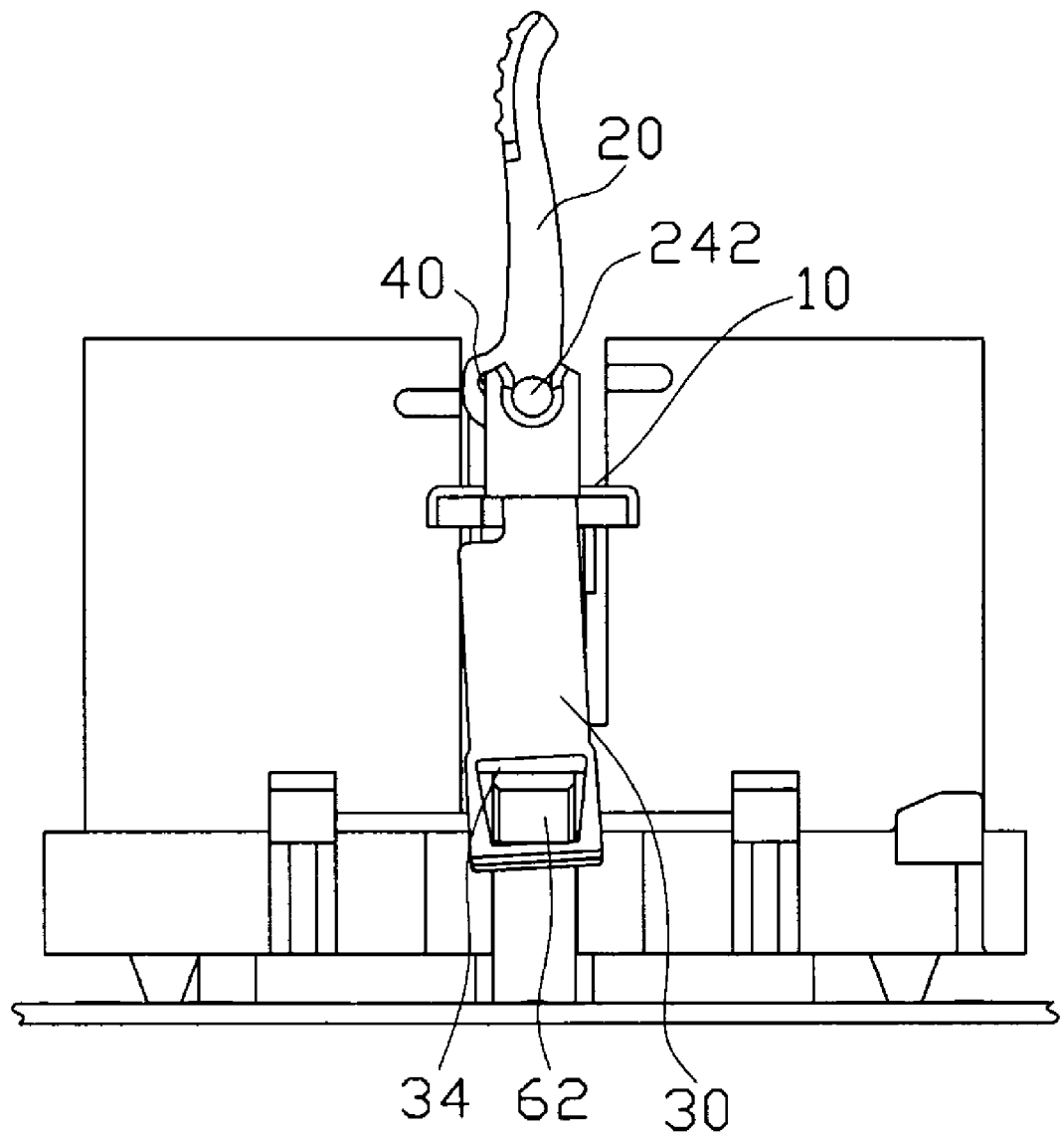
FIG. 3B is another elevation view of FIG. 1 partially assembled.

Referring to FIG. 2, in assembly of the heat sink clip 100, the actuating member 20 is pivotably mounted to the securing portion 16 of the body 10 through the revolving shaft 242 and the grooves 164a in a direction substantially perpendicular to the main axis of the body 10. The upper portion of the movable fastener 30 is then inserted through the slot 162 of the spring plate 12 into the groove 246 of the actuating member 20 from a bottom side toward a top side thereof. The pivot 40 is then fastened to the pivot hole 32 of the movable fastener 30 and the pivot hole 244 of the actuating member 20 to pivotally secure the movable fastener 30 to the actuating member 20 and the spring plate 12. The actuating member 20 is pivotable from an unlocked position to a locked position where it pulls the movable fastener 30 upwardly to fasten with the retention module 60. When operating the actuating member 20, the step 36 is used to avoid interference between the movable fastener 30 and the securing portion 16 (see FIGS. 3B and 3C). The step 36 is always located below the securing portion 16 at the other end of the spring plate 12 of the main body 10.

Referring to FIG. 1 and FIG. 2, in assembly of the heat sink 50 onto the retention module 60, the heat sink 50 is placed on the retention module 60, the spring plate 12 of the body 10 is placed in the locating groove 54 of the heat sink 50. The mounting hole 142 of the locking arm 14 and the mounting hole 34 of the movable fastener 30 are then respectively sleeved onto the locking blocks 62 of the retention module 60, after which, the actuating member 20 is turned from the unlocked position (see FIG. 3A) to the locked position (see FIG. 3C), and the movable fastener 30 is consequently moved upwardly to fasten with the retention module 60, and the actuating member 20 compels the body 10 downwardly to thereby secure the heat sink 50 to the retention module 60, keeping the bottom surface of the heat sink 50 in close contact with the top surface of the heat generating unit 80.

Figure 3C:
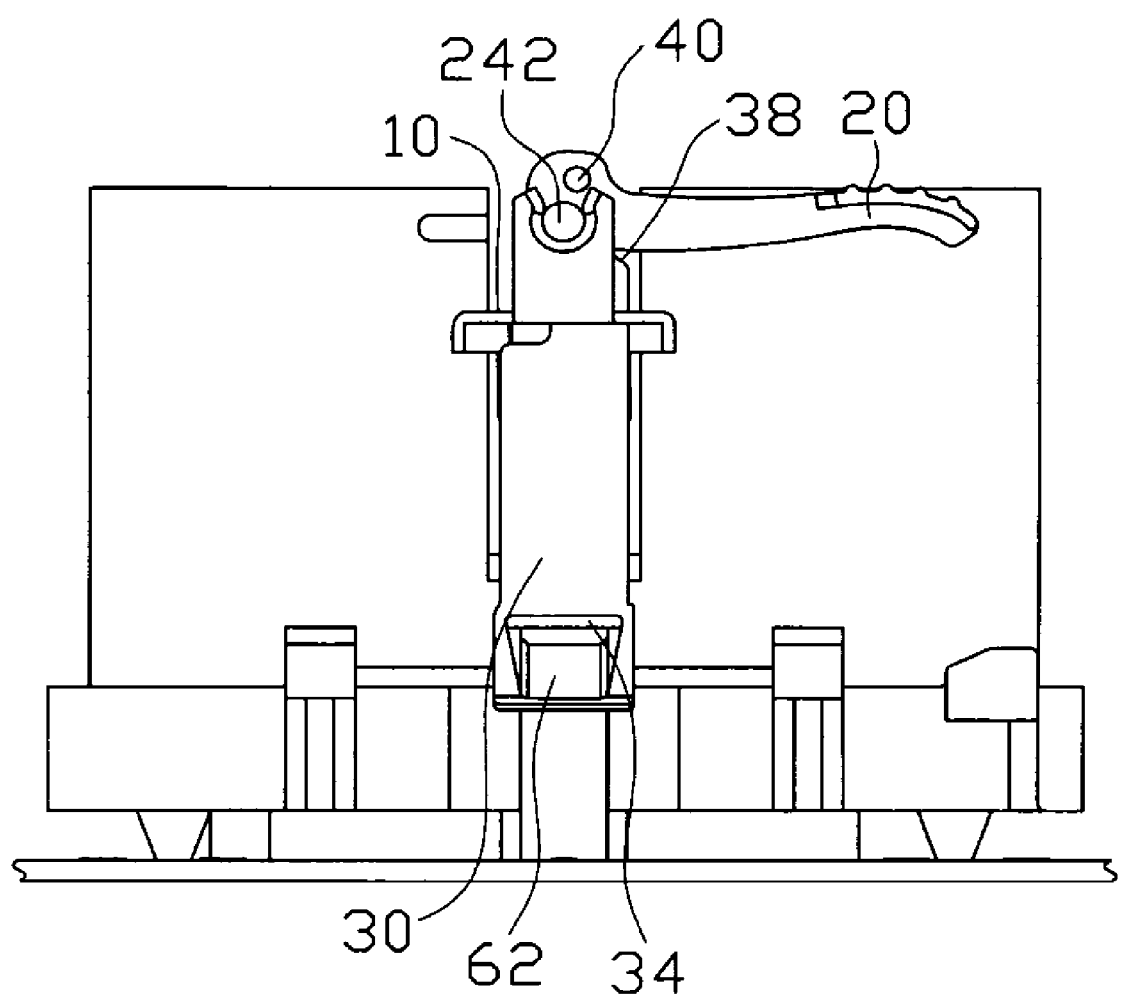
FIG. 3C is a side elevation as in FIG. 3A showing the assembly completed.
Figure 4:
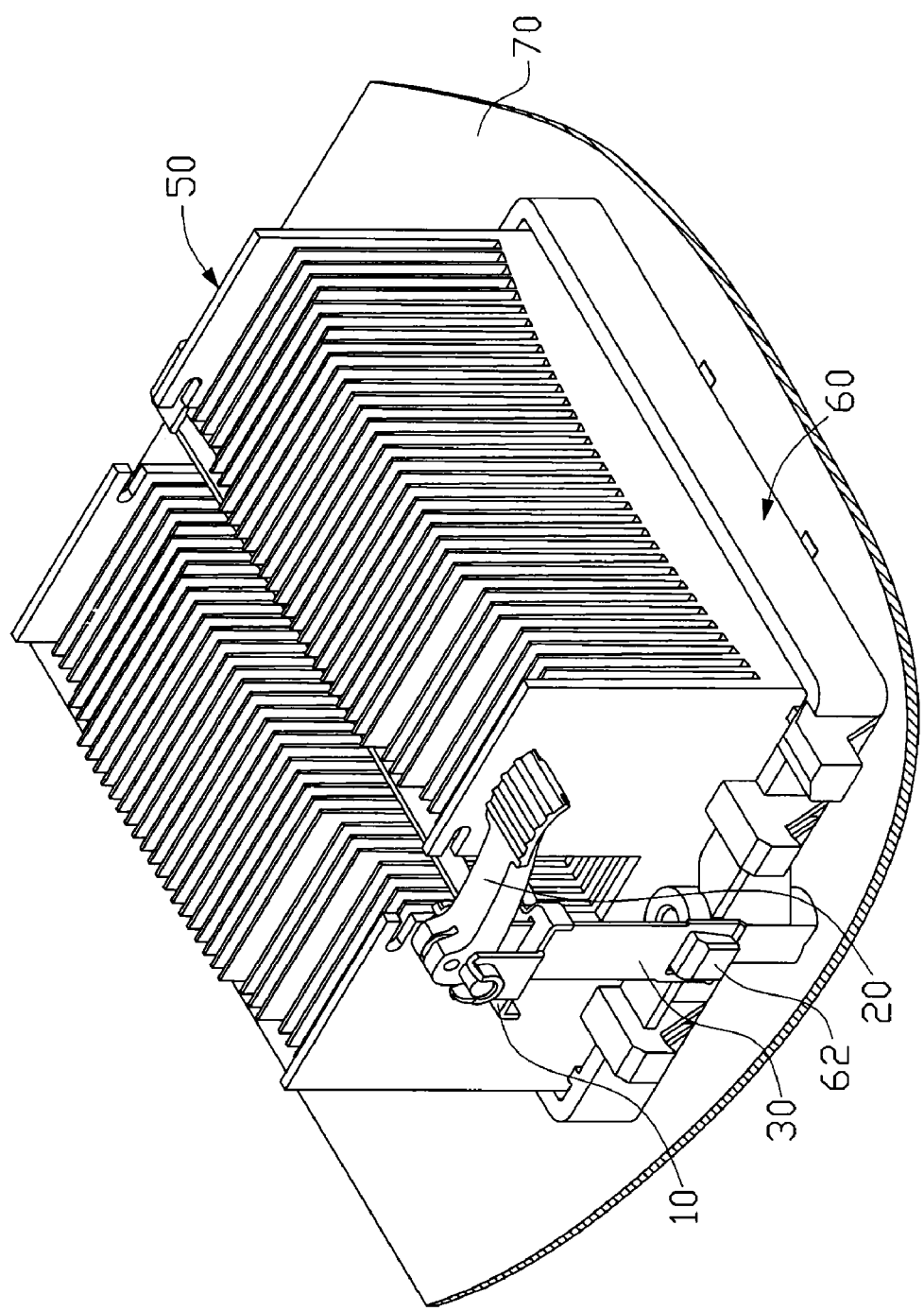
FIG. 4 is an assembled view of FIG. 1.

Referring to FIG. 3C and FIG. 4, at the locked position, the pivot 40 is located on the right of the revolving shaft 242, and the bottom of the hinge portion 24 rests on the step 38 of the movable fastener 30, the heat sink clip 100 is therefore in a self-locking state.

When unlocking the heat sink clip 100, the actuating member 20 is turned from the locked position to the unlocked position, the user can then easily remove the heat sink clip 100 from the retention module 60.

It is easy to understand that the pivot hole 32 can be larger than the pivot 40, wherein the movable fastener 30 can still fulfill its function.

Figure 5:
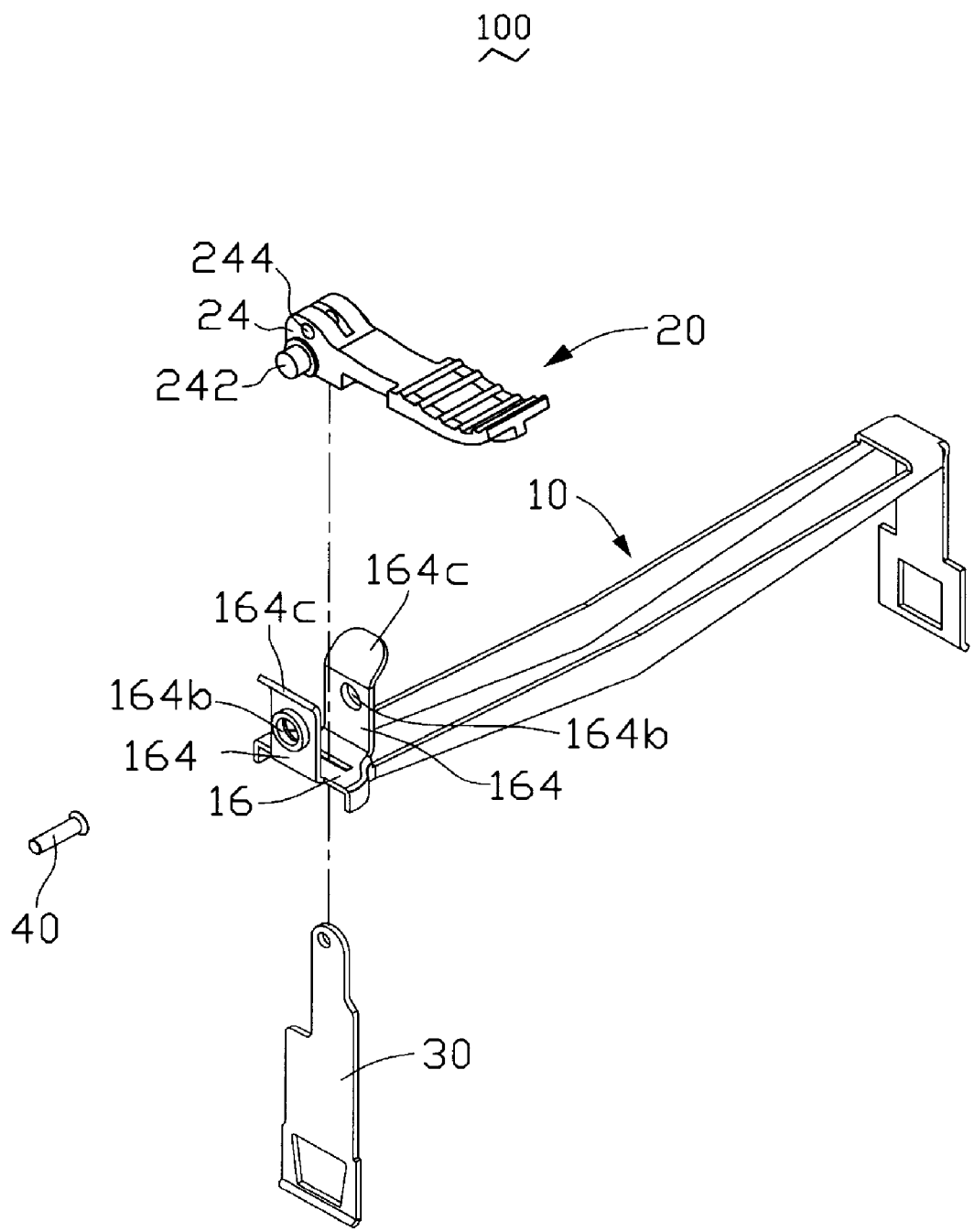
FIG. 5 is an exploded view of a heat sink clip in accordance with a second preferred embodiment of the present invention.

FIG. 5, shows a second preferred embodiment of the present invention. Each of the bearing plates 164 defines a pivot hole 164b therein, and has a handle 164c extending slantingly from the upper portion thereof. In assembly of the heat sink clip 100, the two handles 164c are pulled in opposite directions, and then the actuating member 20 is pivotably mounted to the bearing plates 164 of the body 10 through the revolving shaft 242 received in the pivot holes 164b. The actuating member 20, the movable fastener 30 and other portion of the body 10 of the second preferred embodiment are the same as in the first preferred embodiment.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink clip comprising:
a body extending in a first direction, said body having a securing portion formed at one end thereof;
an actuating member having a hinge portion thereof;
a movable fastener being attached to the hinge portion of said actuating member; the securing portion of the body has a pair of bearing plates extending upwardly therefrom, each of the bearing plates defines a groove therein, wherein
said actuating member being pivotably mounted thereto in a second direction substantially perpendicular to the first direction, said actuating member being turnable relative to said body between an unlocked position and a locked position.

2. The heat sink clip as described in claim 1, wherein said body has a locking arm integrally formed at another end thereof.

3. The heat sink clip as described in claim 1, wherein the movable fastener is pivotably attached to the hinge portion of the actuating member.

4. The heat sink clip as described in claim 3, wherein each of two opposite sides of the hinge portion of the actuating member forms a revolving shaft extending outwardly therefrom, and the revolving shafts are pivotably mounted to the grooves of the bearing plates of said body.

5. The heat sink clip as described in claim 3, wherein the securing portion of said body has a pair of bearing plates extending upwardly therefrom, each of the bearing plates defines a pivot hole therein and forms a handle on an upper portion thereof, each of two opposite sides of the hinge portion forms a revolving shaft extending outwardly therefrom, and the revolving shafts of said actuating member are pivotably mounted to the pivot holes of the bearing plates.

6. The heat sink clip as described in claim 2, wherein an upper portion of said movable fastener defines a pivot hole therein, the hinge portion of said actuating member defines a pivot hole therein, a pivot being extended though the pivot hole of said movable fastener and the pivot hole of said actuating member to thereby pivotably mount the fastener to the actuating member.

7. The heat sink clip as described in claim 5, wherein the securing portion of said body defines a slot therein, said movable fastener received in the slot of the securing portion of said body.

8. The heat sink clip as described in claim 6, said hinge portion of said actuating member defines a groove therein, the upper portion of said movable fastener being received in the groove of the hinge portion of said actuating member.

9. The heat sink clip as described in claim 1, wherein one side of the upper portion of said movable fastener has a step, said actuating member resting on the step of said movable fastener when the actuating member is located at the locked position.

10. A heat sink assembly comprising:
a heat generating unit;
a retention module located about the heat generating unit;
a heat sink seated on the heat generating unit;
a heat sink clip comprising a body, an actuating member and a movable fastener;
said body placed on the heat sink, said body having a locking arm at one end thereof, and a securing portion formed on another end thereof, the locking arm of said body being secured to the retention module;
said actuating member having a hinge portion at one end thereof; the securing portion of the body has a pair of bearing plates extending upwardly therefrom, the actuating member being pivotably mounted to the bearing plates of the body said movable fastener being connected to the hinge portion of said actuating member at one end thereof and secured to the retention module at another end thereof;

said actuating member being pivotably mounted to the securing portion of said body in a direction substantially perpendicular to said body, said actuating member being turnable relative to said body from an unlocked position to a locked position, to compel said body downwardly to thereby secure the heat sink to the heat generating unit.

11. The heat sink assembly as described in claim 10, wherein each of the bearing plates defines a groove therein, said actuating member has a hinge portion at one end thereof, each of two opposite sides of the hinge portion forming a revolving shaft extending outwardly therefrom, the revolving shafts of said actuating member being pivotably mounted to the grooves of the bearing plates.

12. The heat sink assembly as described in claim 11, wherein an upper portion of said movable fastener defines a pivot hole therein, the hinge portion of said actuating member defines a pivot hole therein, wherein the pivot hole of the hinge portion of the actuating member is more near to another end of said actuating member than the revolving shafts of said actuating member, a pivot being fastened to the pivot hole of said movable fastener and the pivot hole the hinge portion of said actuating member.

13. A heat sink clip comprising:

a main body having a first end forming a locking arm with a mounting hole adapted for engaging with a locking block of a retention module and a second end opposite the first end;

a movable fastener having an upper end extending upwardly through the second end of the main body and a lower end defining a mounting hole adapted for engaging with a locking block of the retention module, a first side defining a first step and a second side defining a second step, and a pivot hole in the upper end, wherein the first and second steps being located between the pivot hole and the mounting hole of the movable fastener and wherein the second step being located above the first step; and an actuating member pivotably mounted on the second end of the body and movable between a locked position and an unlocked position, and connected with the upper end of the movable fastener via a pivot extending through the actuating member into the pivot hole of the movable fastener; the second end of the main body forms two upright bearing plates each defining a groove at a top thereof, the actuating member forming two revolving shafts rotatably received in the grooves, respectively;

wherein the actuating member being oriented perpendicular to an orientation of the main body, the first step being located below the second end of the main body and the actuating member has a bottom face close to the second step of the movable fastener when the actuating member being moved to the locked position.

14. The heat sink clip as described in claim 13, wherein the second end of the main body forms two upright plates each defining a hole therein, the actuating member forming two revolving shafts rotatably received in the holes respectively.

15. The heat sink clip as described in claim 13, wherein the actuating member has a first end and a second end, the revolving shafts are formed at the first end and the second end has a face formed with teeth thereon, the actuating member has a pivot hole receiving the pivot therein, the pivot hole of the actuating member is located near the second end than the revolving shafts.

16. The heat sink clip as described in claim 14, wherein the actuating member has a first end and a second end, the revolving shafts are formed at the first end and the second end has a face formed with teeth thereon, the actuating member has a pivot hole receiving the pivot therein, the pivot hole of the actuating member is located near the second end than the revolving shafts.

* * * * *